(12) United States Patent
Roohparvar

(10) Patent No.: US 7,221,603 B2
(45) Date of Patent: May 22, 2007

(54) DEFECTIVE BLOCK HANDLING IN A FLASH MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 11/127,465

(22) Filed: May 12, 2005

(65) Prior Publication Data

US 2006/0256629 A1    Nov. 16, 2006

(51) Int. Cl.
*G11C 29/00* (2006.01)
*G11C 7/00* (2006.01)

(52) U.S. Cl. .............. 365/200; 365/201; 365/185.09; 365/185.11; 365/185.29

(58) Field of Classification Search ............. 365/200, 365/201, 185.09, 185.11, 185.29, 185.33
See application file for complete search history.

(56) References Cited

U.S. PATENT DOCUMENTS

| | | | |
|---|---|---|---|
| 5,293,593 A | 3/1994 | Hodge et al. | |
| 5,630,097 A | 5/1997 | Orbits et al. | |
| 5,699,306 A * | 12/1997 | Lee et al. | 365/200 |
| 5,867,642 A | 2/1999 | Vivio et al. | |
| 5,987,632 A | 11/1999 | Irrinki et al. | |
| 6,262,926 B1 * | 7/2001 | Nakai | 365/200 |
| 6,477,612 B1 | 11/2002 | Wang | |
| 6,496,413 B2 * | 12/2002 | Taura et al. | 365/185.09 |
| 6,532,181 B2 * | 3/2003 | Saito et al. | 365/200 |

\* cited by examiner

*Primary Examiner*—Anh Phung
*Assistant Examiner*—Toan Le
(74) *Attorney, Agent, or Firm*—Leffert Jay & Polglaze, P.A.

(57) ABSTRACT

A method and circuit that remaps, to a single redundant memory block, defective rows from amongst a plurality of defective memory blocks. The circuit determines which rows of each memory block is defective and maps any further access to those rows to the redundant memory block. During an erase operation of the remapped memory rows, the selected rows are biased with an erase voltage, the source line and tub are biased at some high voltage that can be greater than $V_{CC}$. The unselected word lines are biased at a voltage that is substantially equal to the substrate voltage.

31 Claims, 3 Drawing Sheets

DEFECTIVE BLOCK HANDLING IN A FLASH MEMORY DEVICE

TECHNICAL FIELD OF THE INVENTION

The present invention relates generally to memory devices and in particular the present invention relates to defective blocks in flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. Each of the memory cells includes a floating gate field-effect transistor capable of holding a charge. Each of the cells can be electrically programmed on a random basis by charging the floating gate. The data in a cell is determined by the presence or absence of the charge in the floating gate. The charge can be removed from the floating gate by a block erase operation.

As electronic devices become smaller, their components such as the flash memory must also be reduced in size. At the same time, the memory devices are becoming denser to keep up with the increasing performance of the electronic devices.

As memory devices are scaled, the tolerances in the manufacturing are reduced as well. This translates into a greater quantity of defects from shorting of different layers of the memory devices, thus reducing the yield and increasing the cost of the device. Since one reason for the smaller, denser memory devices is to reduce costs, the decreased yield problem is contrary to the move to more advanced processes to lower costs.

Redundancy has been used to improve the defective memory situation. For example, some memory devices have column and memory block redundancy that can be used to replace defective columns and blocks with extra columns and/or blocks of memory. NAND flash memory typically uses block redundancy to replace defective memory blocks. However, only a limited quantity of redundant blocks can be included on a memory die. Remapping an entire memory block when only one row or column is defective in a memory block can eventually use up all of the redundant memory blocks. This can leave too many defects on the die.

For the reasons stated above, and for other reasons stated below which will become apparent to those skilled in the art upon reading and understanding the present specification, there is a need in the art for a flash memory device that has improved handling of defective memory blocks.

SUMMARY

The above-mentioned problems with a non-volatile memory device and other problems are addressed by the present invention and will be understood by reading and studying the following specification.

The present invention encompasses a method for handling defective memory blocks in a memory device. The method is comprised of determining which rows of a memory array are defective. Only the defective rows are then remapped to a redundant memory block. Multiple defective memory blocks can have their rows remapped to a single redundant memory block.

In one embodiment, the remapped rows are selectively erased by biasing the selected rows with an erase voltage such as ground potential while the tub and source line are biased at a high voltage such as one greater than $V_{CC}$. The unselected rows of the redundant memory block are biased with an inhibit voltage that is substantially equal to the tub voltage.

In yet another embodiment, half of a defective block is used to replace half of another defective block. In this embodiment, the defective area or half the block is remapped to the non-defective area of the other defective block. In such an embodiment, an erase operation erases both blocks.

In still another embodiment, predetermined portions of a plurality of memory blocks are remapped to another defective memory block. For example, one third of three different defective memory blocks can be mapped to another defective memory block location.

Further embodiments of the invention include methods and apparatus of varying scope.

DETAILED DESCRIPTION

Figure 1:
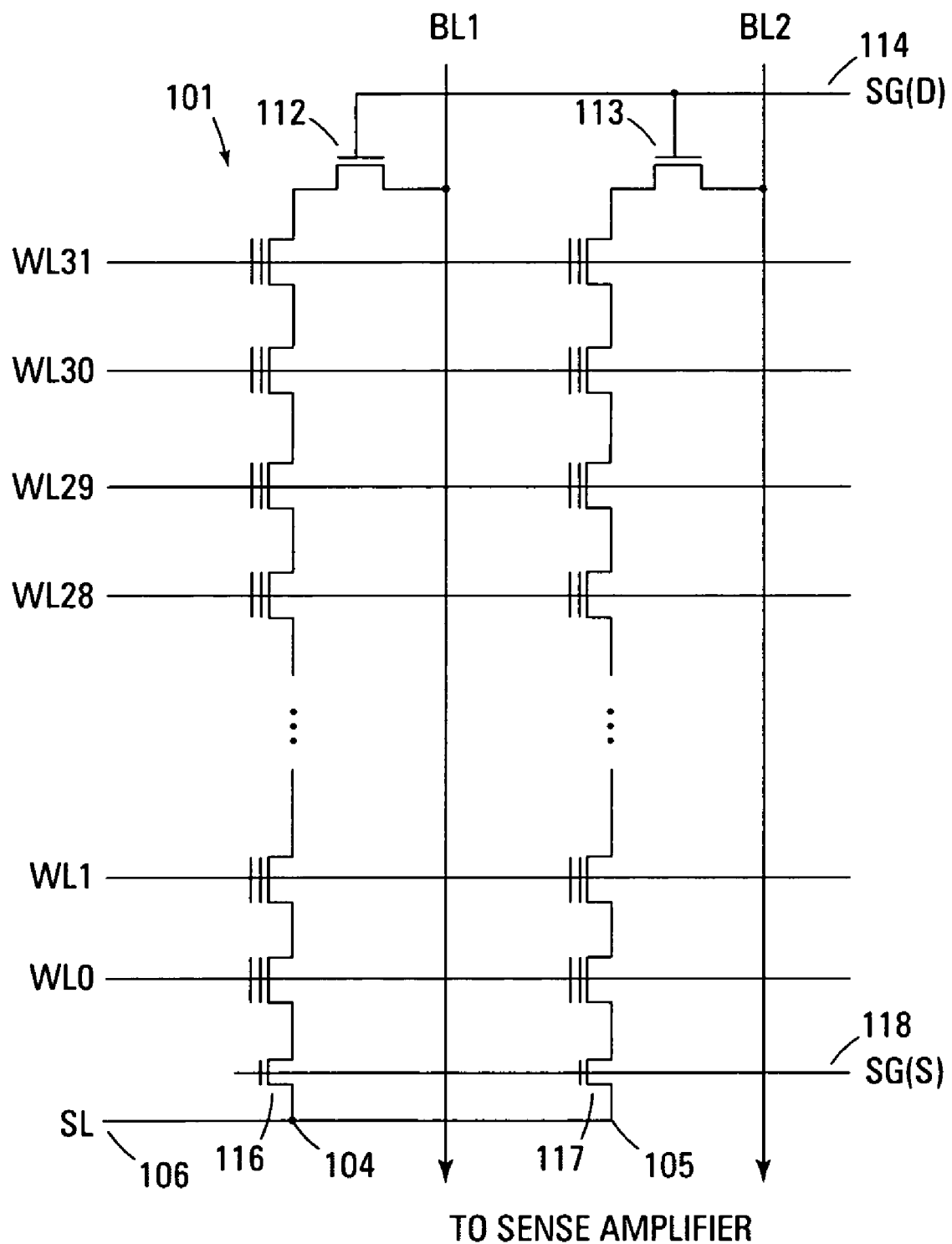
FIG. 1 shows a simplified schematic diagram of a flash memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified schematic diagram of a NAND flash memory array. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1–BLN).

The array is comprised of an array of floating gate cells 101 arranged in series columns 104, 105. Each of the floating gate cells 101 are coupled drain to source in each series chain 104, 105. A word line (WL0–WL31) that spans across multiple series strings 104, 105 is coupled to the control gates of every floating gate cell in a row in order to control their operation. The bit lines (BL1–BLN) are eventually coupled to sense amplifiers (not shown) that detect the state of each cell.

In operation, the word lines (WL0–WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1–BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

The memory cells are usually grouped into memory blocks. A block is typically defined by the total number of bits per word line multiplied by the total number of cells per string. In one embodiment, a memory block has 16 k columns with 32 rows. Alternate embodiments can have other memory block formats.

One embodiment of the present invention maps a defective row or rows from a memory block to the same quantity of rows in a redundant memory block. Therefore, instead of mapping an entire memory block to an entire redundant memory block when only a small number of rows are defective, only the rows that are defective are actually mapped to the redundant block. Additionally, only those rows in the redundant block are used to which defective rows have been mapped. The redundant memory block can then be used as redundant rows for multiple memory blocks.

A typical prior art erase operation erases all of the rows of a block together. The erase operation of the present invention biases unselected rows of the block being erased with an inhibit voltage. The primary mechanism for an erase operation is the voltage drop between the gate and the substrate channel. In one embodiment of the erase operation of the present invention, the inhibit voltage is the same potential as the substrate so that there is no voltage drop between the gate and the channel.

Figure 2:
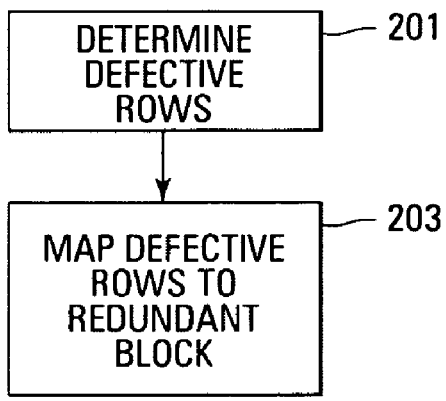
FIG. 2 shows a flowchart of one embodiment of a method of the present invention for defective memory block handling in a memory array.

FIG. 2 illustrates a flowchart of one embodiment of a method of the present invention for defective memory block handling in a memory array. The embodiment is comprised of testing the memory array to determine which rows are defective 201. The type of testing and the types of defects are well known in the art. The testing can include writing checkerboard and inverse checkerboard patterns to memory. The defects can include shorted word lines and defective memory cells. Alternate embodiments may use other types of testing and/or other types of defects may be found.

The defective rows are mapped to the same quantity of rows of a redundant block 203. In this embodiment, defective rows from multiple blocks can be mapped to a single redundant block.

Figure 3:
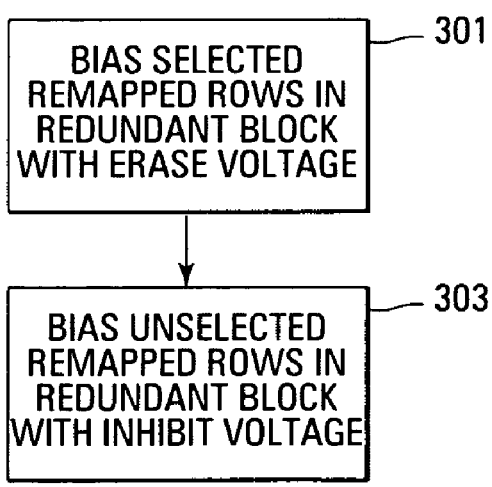
FIG. 3 shows a flowchart of one embodiment of a method for an erase operation in accordance with the defective memory block handling of the present invention.

FIG. 3 illustrates a flowchart for one embodiment of a method for an erase operation of the present invention. The erase operation is performed on a redundant memory block to which a plurality of defective memory cell rows has been mapped. This method prevents all of the remapped rows in the redundant memory block from being erased simultaneously as would normally be done.

The selected remapped rows are biased with an erase voltage 301. In one embodiment, this voltage is 0V. The tub (i.e., portion of the substrate in which the memory cells are fabricated) and the source line are biased at some high voltage that is greater than $V_{CC}$ (e.g., 20V). Alternate embodiments can use other erase bias voltages.

The unselected word lines in the redundant block are biased at some inhibit voltage 303. For example, a high voltage that is greater than $V_{CC}$ (e.g., 20V) and substantially equal to the substrate bias. As discussed previously, when both the channel in the tub and the control gate have substantially the same voltage, the erase mechanism is inhibited. Alternate embodiments can use other inhibit voltages.

The unselected word lines are those lines that are not desired to be erased. These rows can include redundant rows that are not used and/or rows that have been remapped from defective rows of another memory block.

Figure 4:
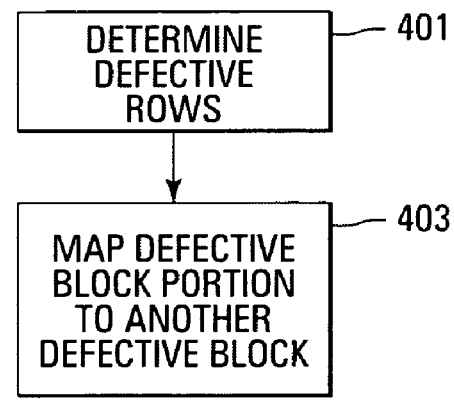
FIG. 4 shows a flowchart of an alternate embodiment of a method of the present invention for handling defective memory blocks.

FIG. 4 illustrates a flowchart for an alternate embodiment of a method of the present invention for handling defective memory blocks. Instead of remapping an entire defective memory block as in the prior art, the remapping method, in this embodiment, maps half of a defective block to replace half of another defective block. This reduces by half the total number of defective blocks.

The method is comprised of performing a test on the memory array to determine which rows of the each block are defective 401. Since the memory control circuitry tracks which memory blocks are bad, it can remap the defective area of one or more memory blocks to the non-defective area of another defective block 403. In one embodiment, this remapping method is performed in half-block increments. Alternate embodiments can use other block size increments. In the embodiment of FIG. 4, the two defective blocks are erased simultaneously so that there is no potential program disturb issues.

All of the remapping/erasing embodiments of the present invention are invisible to the user. For example, during a programming operation, all addressing to a defective row or block is automatically remapped to the redundant row/block.

Figure 5:
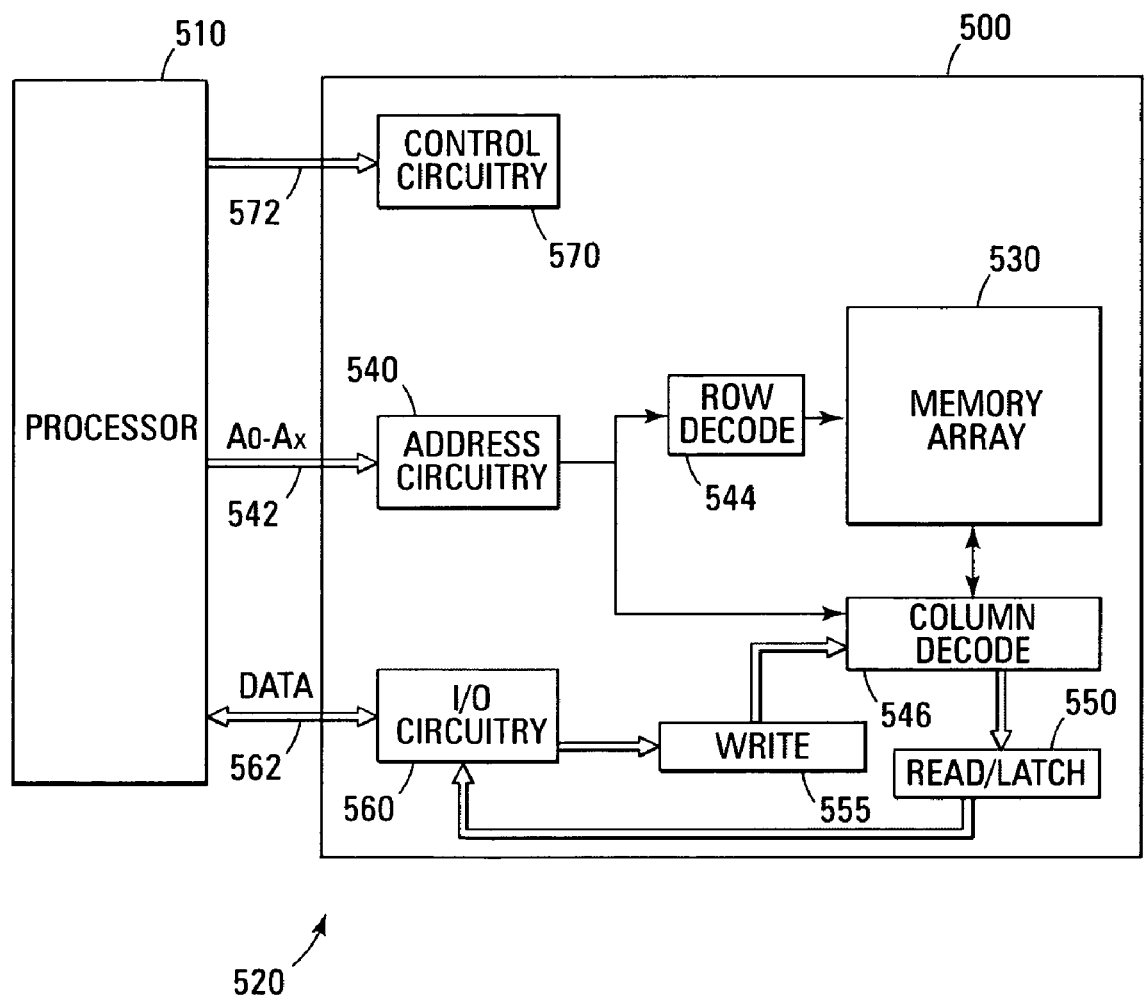
FIG. 5 shows a block diagram of one embodiment of an electronic system of the present invention.

FIG. 5 illustrates a functional block diagram of a memory device 500 of one embodiment of the present invention that is coupled to a processor 510. The processor 510 may be a microprocessor, a processor, or some other type of controlling circuitry. The memory device 500 and the processor 510 form part of an electronic system 520. The memory device 500 has been simplified to focus on features of the memory that are helpful in understanding the present invention.

The memory device includes an array of memory cells 530. In one embodiment, the memory cells are non-volatile floating-gate memory cells and the memory array 530 is arranged in banks of rows and columns.

An address buffer circuit 540 is provided to latch address signals provided on address input connections A0–Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The above-described embodiments have focused on a NAND architecture memory array. However, the present invention is not limited to this architecture. The embodiments of the present invention can be used in any architecture of memory device (e.g., NAND, NOR, AND).

The memory device 500 reads data in the memory array 530 by sensing voltage or current changes in the memory array columns using sense/latch circuitry 550. The sense/latch circuitry, in one embodiment, is coupled to read and latch a row of data from the memory array 530. Data input and output buffer circuitry 560 is included for bi-directional data communication over a plurality of data connections 562 with the controller 510). Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 executes the embodiments of the memory cell row remapping and erasing of the present invention. The control circuitry 570 may be a state machine, a sequencer, or some other type of controller.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the embodiments of the present invention provide more effective ways to handle defective blocks in a memory device. With multiple defective blocks sharing the same redundant block, the embodiments of the present invention can reduce the total number of defective blocks and thus increase chip yield.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for remapping defective memory in a memory device, the method comprising:
   determining which rows of a memory array are defective; and
   remapping only the defective rows to a defective memory block.

2. The method of claim 1 memory device is a NAND flash memory device.

3. The method of claim 1 wherein the defective rows comprise short conditions.

4. The method of claim 1 wherein the defective rows comprise defective memory cells.

5. The method of claim 1 and further including accessing the defective rows and being rerouted to the redundant memory block.

6. The method of claim 1 wherein the defective rows are located in a plurality of memory blocks of the memory array.

7. The method of claim 1 wherein the defective rows are remapped to only a first redundant memory block.

8. The method of claim 1 and further including selectively erasing the remapped rows.

9. A method for remapping defective memory in a memory device, the method comprising:
   determining which rows of each of a plurality of memory blocks are defective; and
   remapping only the defective rows of each of the plurality of memory blocks to a non-defective area of a first defective memory block.

10. The method of claim 9 and further including selectively biasing the remapped rows with erase voltages.

11. The method of claim 10 wherein the erase voltages comprise biasing selected rows of the first redundant memory block at ground potential and biasing a source line and a tub in which the selected rows are fabricated with a first voltage that is greater than $V_{CC}$.

12. The method of claim 11 and further including selectively inhibiting erase in the first redundant memory block by biasing unselected rows at a voltage that is substantially equal to the first voltage.

13. A method for remapping defective memory rows in a memory device comprising a plurality of memory blocks, the method comprising:
   determining which rows of each of the plurality of memory blocks are defective;
   remapping only the defective rows of each of the plurality of memory blocks to non-defective areas of a first defective memory block; and
   selectively erasing the rows of the first redundant memory block by biasing select word lines with an erase voltage and inhibiting unselected word lines with an inhibit voltage.

14. The method of claim 13 wherein the erase voltage is 0V and the inhibit voltage is 20V.

15. The method of claim 13 wherein selectively erasing comprises biasing a tub at a first voltage greater than $V_{CC}$ and selectively inhibiting the unselected word lines comprising biasing the unselected word lines at the first voltage.

16. A memory device comprising:
   a memory array comprised of a plurality of memory blocks; and
   controller circuitry, coupled to the memory array, for controlling operation of the memory device, the controller circuitry adapted to remap defective rows of the memory array to a non-defective area of at least one defective memory block such that the circuitry determines which rows of any of the plurality of memory blocks are defective and remaps only the defective rows to the at least one defective memory block.

17. The device of claim 16 wherein the memory array is a flash memory array.

18. An electronic system comprising:
   a processor that generates memory signals; and
   a flash memory device, coupled to the processor, that operates in response to the memory signals, the device comprising:
      a memory array comprised of a plurality of memory blocks; and
      controller circuitry, coupled to the memory array, for controlling operation of the memory device, the controller circuitry adapted to remap defective rows of the memory array to a non-defective area of at least one defective memory block such that the circuitry determines which rows of any of the plurality of memory blocks are defective and remaps only the defective rows to the at least one defective memory block.

19. The system of claim 18 wherein the processor is a state machine.

20. The system of claim 18 wherein the flash memory device is a NAND type flash memory device.

21. A method for remapping defective memory in a memory device having a memory array comprising a plurality of memory blocks, the method comprising:
   determining a first memory block having at least one defective memory row of a plurality of memory rows;

determining a second memory block having at least one defective memory row of a plurality of memory rows; and remapping only a predetermined portion of the first memory block to a non-defective portion of the second memory block.

22. The method of claim 21 wherein the predetermined portion is half of the first memory block.

23. The method of claim 21 wherein the predetermined portion is only the defective memory rows of the first memory block.

24. The method of claim 21 and further including during an erase operation, erasing both the first memory block and the second memory block.

25. A memory device comprising:
a memory array comprising a plurality of memory blocks; and
controller circuitry, coupled to the memory array, for controlling operation of the memory device, the controller circuitry adapted to determine first and second memory blocks of the plurality of memory blocks that are defective and to remap a predetermined portion of the first memory block to a non-defective portion of the second memory block.

26. The device of claim 25 wherein less than the predetermined portion comprises defective rows.

27. The device of claim 25 wherein the non-defective portion comprises half of the second memory block.

28. A method for erasing a redundant memory block that has been fabricated in a substrate and to which defective memory rows have been remapped, the method comprising:
selectively biasing selected word lines of the redundant memory block with an erase voltage;
biasing the substrate at a substrate voltage; and
biasing unselected word lines of the redundant memory block with an inhibit voltage.

29. The method of claim 28 wherein the erase voltage is ground potential and the inhibit voltage is 20V.

30. The method of claim 28 wherein the inhibit voltage and the substrate voltage are substantially equal.

31. A method for remapping defective memory in a memory device having a memory array comprising a plurality of memory blocks, the method comprising:
determining a plurality of defective memory blocks having at least one defective memory row of a plurality of memory rows; and
remapping only a predetermined portion of each of the plurality of defective memory blocks to another defective memory block to create a non-defective memory block.

* * * * *